US008237781B2

United States Patent
Yamauchi et al.

(10) Patent No.: US 8,237,781 B2
(45) Date of Patent: Aug. 7, 2012

(54) MOVING DEVICE AND ELECTRONIC COMPONENT MOUNTING

(75) Inventors: Jun Yamauchi, Fukuoka (JP); Naoto Kohketsu, Saga (JP); Tadashi Endo, Fukuoka (JP); Yasuichi Okada, Kumamoto (JP)

(73) Assignee: Panasonic Corporation, Osaka (JP)

( * ) Notice: Subject to any disclaimer, the term of this patent is extended or adjusted under 35 U.S.C. 154(b) by 529 days.

(21) Appl. No.: 12/447,994

(22) PCT Filed: Nov. 1, 2007

(86) PCT No.: PCT/JP2007/071668
§ 371 (c)(1),
(2), (4) Date: Apr. 30, 2009

(87) PCT Pub. No.: WO2008/056721
PCT Pub. Date: May 15, 2008

(65) Prior Publication Data
US 2010/0060724 A1    Mar. 11, 2010

(30) Foreign Application Priority Data

Nov. 6, 2006   (JP) ................................ 2006-299929

(51) Int. Cl.
*H04N 7/18* (2006.01)

(52) U.S. Cl. .......................................... 348/61; 348/68

(58) Field of Classification Search .................... 348/61, 348/68
See application file for complete search history.

(56) References Cited

U.S. PATENT DOCUMENTS

| 5,839,186 | A | 11/1998 | Onodera |
| 6,154,954 | A | 12/2000 | Seto et al. |
| 6,691,400 | B1 * | 2/2004 | Negishi et al. ................ 29/740 |
| 2002/0080236 | A1 | 6/2002 | Madsen et al. |
| 2006/0042075 | A1 * | 3/2006 | Nakai et al. .................... 29/740 |
| 2006/0153426 | A1 | 7/2006 | Pasqualini et al. |

(Continued)

FOREIGN PATENT DOCUMENTS

EP     0 730 397     9/1996
(Continued)

OTHER PUBLICATIONS

International Search Report issued Feb. 29, 2008 in the International (PCT) Application of which the present application is the U.S. National Stage.

(Continued)

*Primary Examiner* — Djenane Bayard
(74) *Attorney, Agent, or Firm* — Wenderoth, Lind & Ponack, L.L.P.

(57) ABSTRACT

An electronic component mounting apparatus includes two second linear-motion devices on each of which an image pickup device and a mounting head are placed so as to be movable in an X direction, a first linear-motion device for moving the second linear-motion devices in a Y direction independently of each other, in which the image pickup device is placed at such a position as to be contained within an X-directional width of the mounting head and moreover contained within a Y-directional total width of the mounting head and the second linear-motion device. Thus, since the image pickup region of the camera is contained within the moving region of the mounting head, there is no need for ensuring a moving distance taking into account only the camera's image pickup region, so that the moving-axis length of the second linear-motion devices can be reduced.

17 Claims, 9 Drawing Sheets

U.S. PATENT DOCUMENTS

2006/0201999 A1* 9/2006 Haji .................. 228/112.1
2007/0124922 A1 6/2007 Kawasumi et al.

FOREIGN PATENT DOCUMENTS

| EP | 1 542 523 | 6/2005 |
|---|---|---|
| JP | 6-152195 | 5/1994 |
| JP | 2740682 | 1/1998 |
| JP | 10-209688 | 8/1998 |
| JP | 10-209691 | 8/1998 |
| JP | 2005-123371 | 5/2005 |
| JP | 2005-175315 | 6/2005 |

OTHER PUBLICATIONS

Written Opinion of the International Searching Authority issued Feb. 29, 2008.

Response to Written Opinion of International Searching Authority issued Feb. 29, 2009.

* cited by examiner

MOVING DEVICE AND ELECTRONIC COMPONENT MOUNTING

TECHNICAL FIELD

The present invention relates to a moving device for moving a mounting head which acts to hold and mount electronic components onto a circuit board, and also relates to an electronic component mounting apparatus including the moving device.

BACKGROUND ART

In the field of electronic component mounting, electronic component mounting apparatuses including a moving device for moving the mounting head horizontally with respect to a working plane have been widely used. As this horizontal moving device, a Cartesian robot (X-Y robot) composed of a first linear-motion device for moving the mounting head in a first direction (X direction) extending along the working plane and a second linear-motion device for moving the first linear-motion device in a second direction (Y direction) orthogonal to the first direction is widely used. In such an electronic component mounting apparatus, the mounting head is movable within a rectangular plane of which two sides orthogonal to each other are given by respective moving axes of the first linear-motion device and the second linear-motion device. See, e.g., Japanese patent publication No. 2740682.

BRIEF SUMMARY OF THE INVENTION

The electronic component mounting apparatus is provided with an image pickup device for performing position recognition of a board, and such an image pickup device is set on the mounting head so as to be movable integrally therewith. The first linear-motion device and the second linear-motion device have lengths of their respective moving axes which are so defined that the moving range of the image pickup device and the mounting head corresponds to the entire surface of the board. Accordingly, there are some cases where longer moving axes are required depending on the positional relationship between the image pickup device and the mounting head.

In recent years, with a view to achieving functional improvement of the electronic component mounting apparatus, there has been a desire that the mounting head, the Cartesian robot and the like are replaceable with ones of models corresponding to users' modes of use so as to allow flexible customizations to be fulfilled. Also, there are further demands for improvement in areal productivity in addition to conventionally regarded time productivity. To meet these demands, it is of importance that the Cartesian robot itself, i.e., the first and second linear-motion devices themselves are scaled down so as to reduce the equipment area, which in turn necessitates properly setting the placement of the image pickup device.

Therefore, an object of the present invention, lying in solving the above-described issues, is to provide a moving device for moving a mounting head which acts to hold and mount electronic components onto a circuit board, where an image pickup device to be moved by the moving device integrally with the mounting head is properly set for its placement, as well as an electronic component mounting apparatus including this moving device.

In order to achieve the above object, the present invention has the following constitutions.

According to a first aspect of the present invention, there is provided a moving device for moving a mounting head which holds and mounts electronic components onto a board, comprising:

a beam which extends in one direction;

a slider provided on the beam so as to be movable in the one direction;

a drive unit for driving movement of the slider along the one direction;

a mounting head fixed to the slider so as to be movable integrally with the slider; and an image pickup device, which is fixed to the slider so as to be movable integrally with the slider, for picking up an image of a mounting position for the electronic components on the board, wherein the image pickup device is placed at such a position as to be contained within a width of the mounting head in the one direction.

According to a second aspect of the present invention, there is provided a moving device for moving a mounting head which holds and mounts electronic components onto a board, comprising:

a first beam which extends in a first direction;

a slider provided on the first beam so as to be movable in the first direction;

a first drive unit for driving movement of the slider along the first direction;

a mounting head fixed to the slider so as to be movable integrally with the slider;

an image pickup device, which is fixed to the slider so as to be movable integrally with the slider, for picking up an image of a mounting position for the electronic components on the board;

a second beam for supporting the first beam so that the first beam is movable in a second direction orthogonal to the first direction; and a second drive unit for driving movement of the first beam along the second direction, wherein the image pickup device is placed at such a position as to be contained within a width of the mounting head in the first direction and moreover contained within a total width of the mounting head and the first beam in the second direction.

According to a third aspect of the present invention, there is provided the moving device as defined in the second aspect, wherein the mounting head, the image pickup device, the slider, the first beam and the first drive unit are provided in a plurality of sets, respectively, where the second beam supports the plurality of first beams so that the first beams are movable independently of each other or one another.

According to a fourth aspect of the present invention, there is provided the moving device as defined in the second aspect, wherein the image pickup device includes a plurality of first light illuminating units for emitting light at a first illuminating angle toward a mounting position for the electronic components on the board and a plurality of second light illuminating units for emitting light at a second illuminating angle different from the first illuminating angle toward the mounting position, and at a lower portion of the image pickup device, the plurality of first light illuminating units and the plurality of second light illuminating units are placed on one identical plane extending along a surface of the board.

According to a fifth aspect of the present invention, there is provided the moving device as defined in the fourth aspect, wherein a placement region of the plurality of first light illuminating units and the second light illuminating units on the identical plane is so set that a width thereof in the second direction is shorter than a width thereof in the first direction.

According to a sixth aspect of the present invention, there is provided an electronic component mounting apparatus comprising:

a board holding unit for holding the board along a working plane; and the moving device as defined in any one of the first to fifth aspects, wherein mounting of the electronic components onto the board held by the board holding unit is performed by the mounting head moved parallel to the working plane by the moving device.

According to the present invention, in a moving device including a beam which extends in one direction, and a slider which is provided on the beam so as to be movable along the one direction and on which a mounting head and an image pickup device are fixed, the image pickup device is placed at such a position as to be contained within the width of the mounting head in the one direction, by which the moving range of the slider necessary for mounting of electronic components onto the board can be reduced to the least. Therefore, the one-directional length of the beam, which is the moving axis for moving the slider, can be reduced through the proper setting of the placement of the image pickup device, allowing a size reduction of the moving device to be achieved so that the equipment area can be reduced.

Furthermore, in a moving device further including a second beam for moving a first beam in a second direction orthogonal to the one direction, the image pickup device is further properly set for its placement so as to be contained within a width (total width) of the mounting head and the first beam in the second direction. Thus, a size reduction of the moving device (orthogonal moving device) in which two moving devices are provided orthogonal to each other can be realized.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
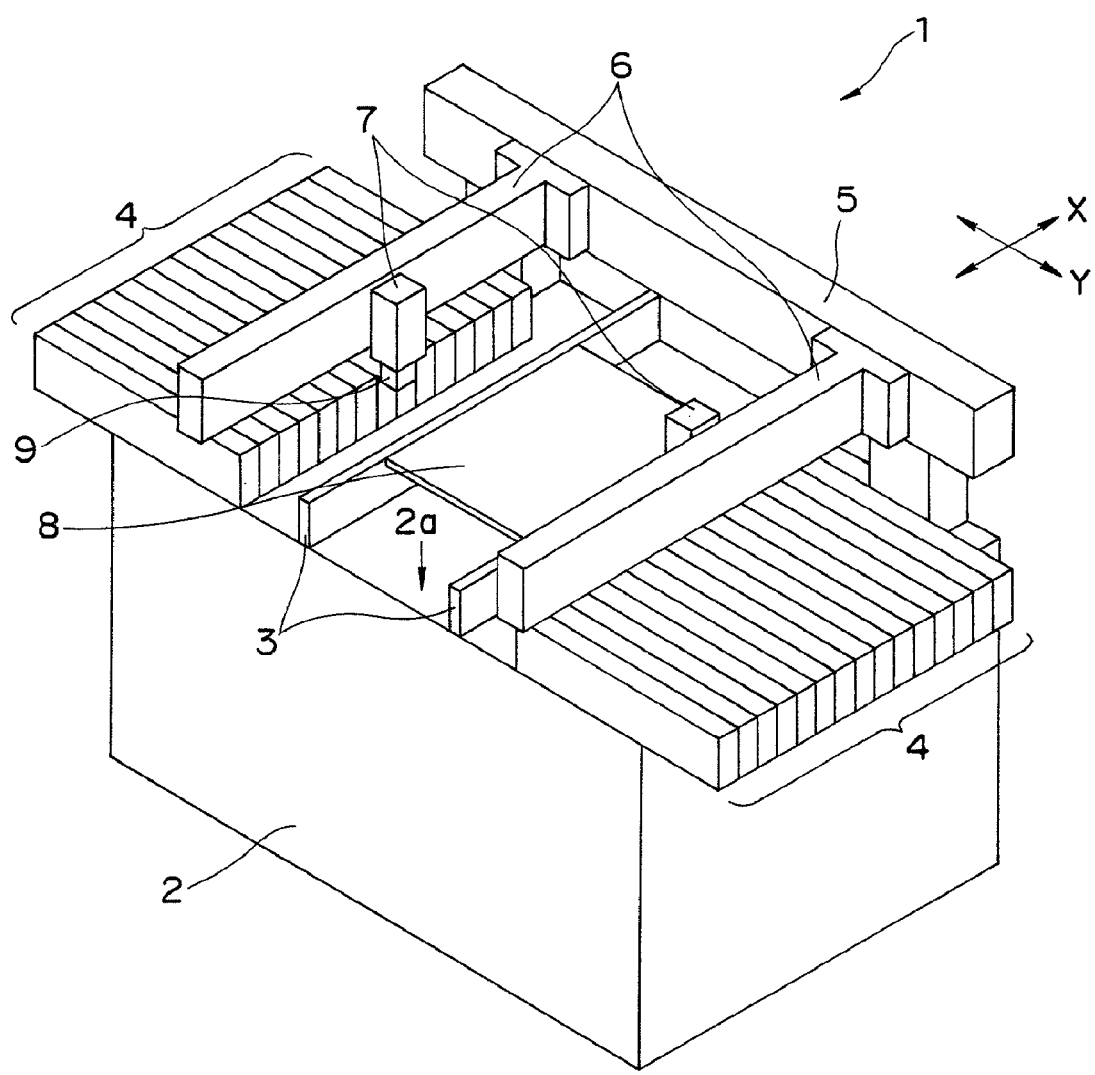
FIG. 1 is a schematic perspective view of an electronic component mounting apparatus according to a first embodiment of the present invention.

Before the description of the present invention proceeds, it is to be noted that like parts are designated by like reference numerals throughout the accompanying drawings.

Hereinbelow, embodiments of the present invention will be described in detail with reference to the accompanying drawings.

First Embodiment

Figure 2:
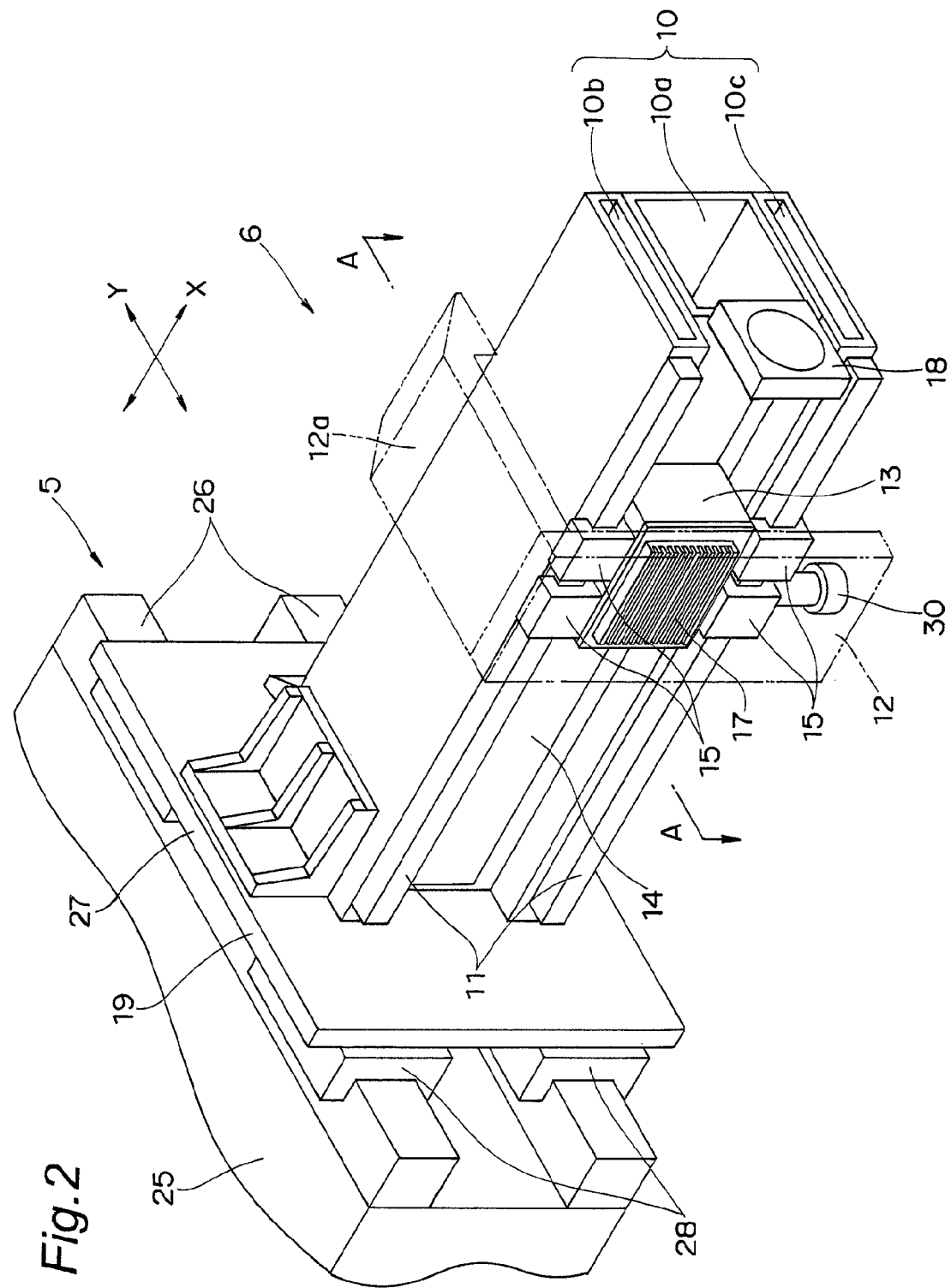
FIG. 2 is a schematic perspective view of a linear-motion device of the first embodiment.
Figure 3:
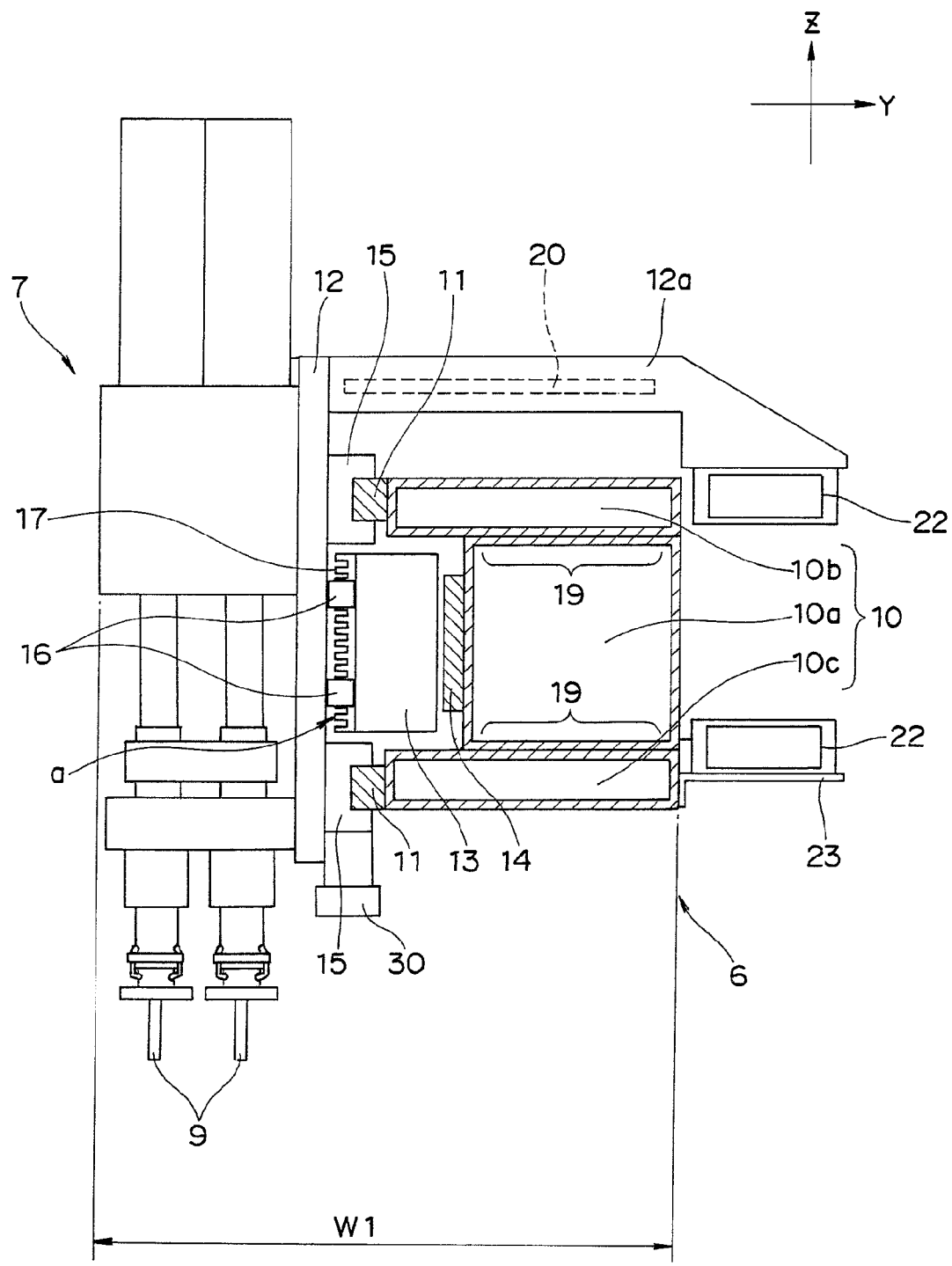
FIG. 3 is a sectional view of the linear-motion device of FIG. 2 taken along the line A-A.
Figure 4:
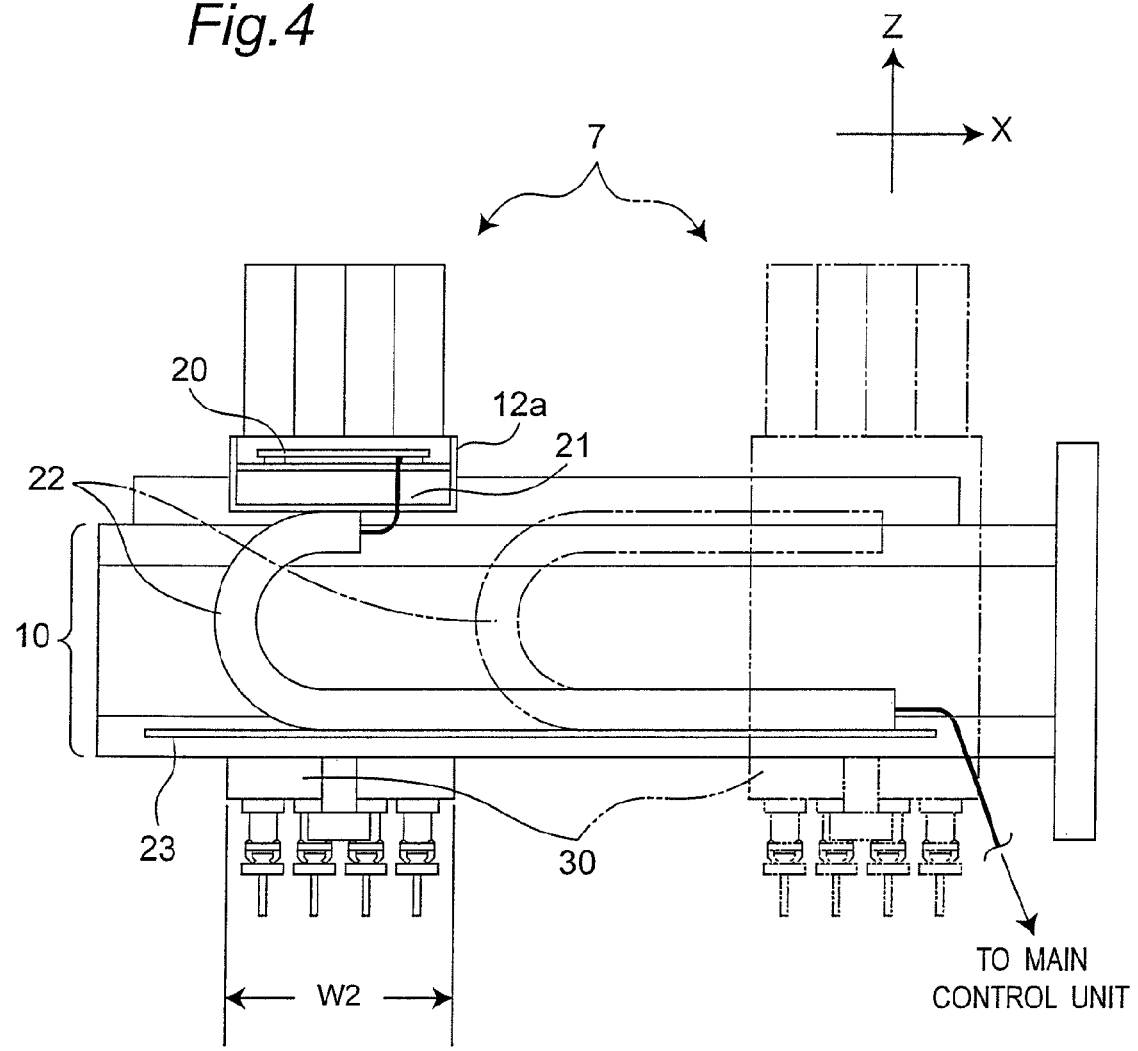
FIG. 4 is a schematic side view of the linear-motion device of the first embodiment.
Figure 5:
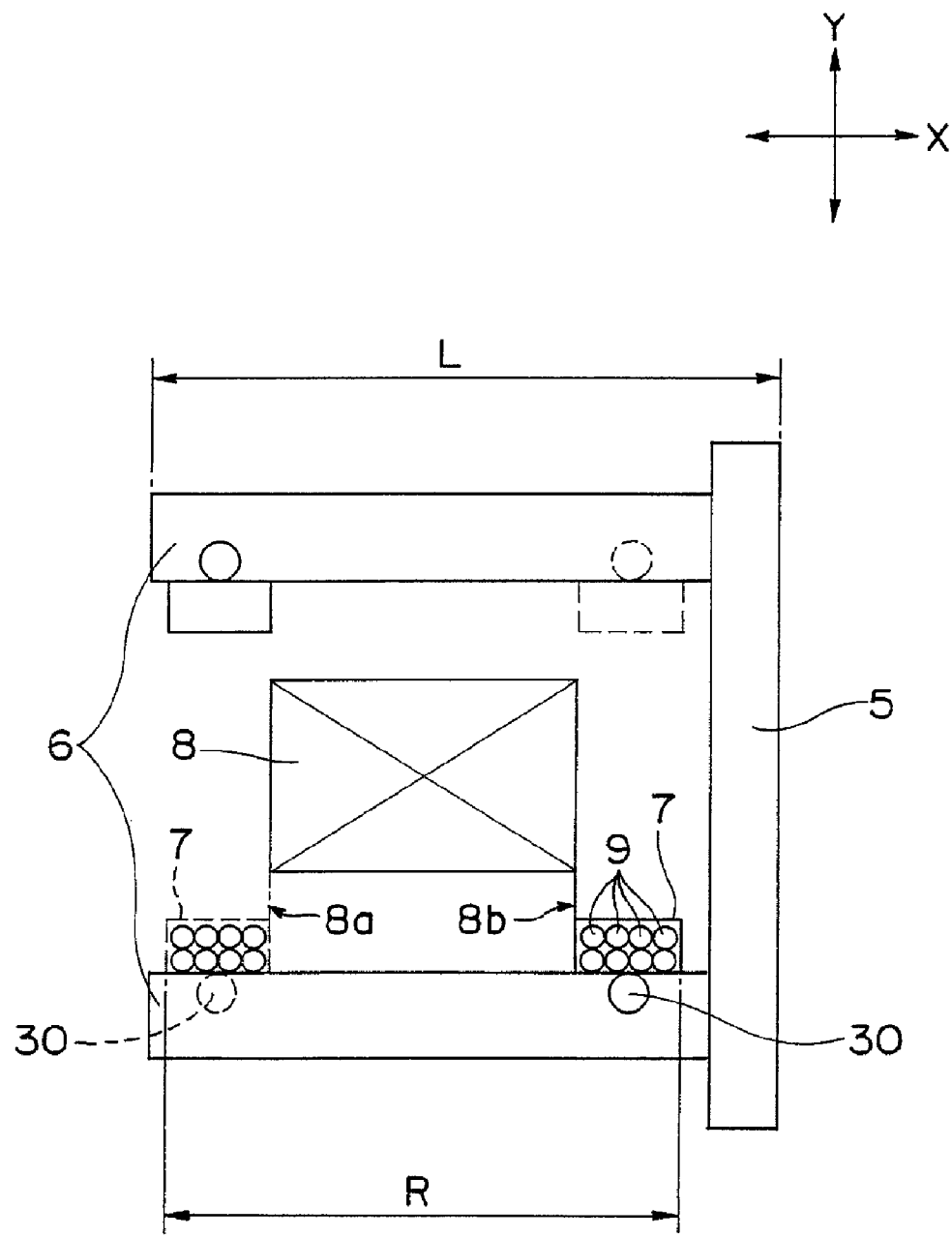
FIG. 5 is a schematic plan view showing a positional relationship between board and image pickup device.

An electronic component mounting apparatus including a linear-motion device which is an example of the moving device according to a first embodiment of the invention is explained with reference to the accompanying drawings. FIG. 1 is a perspective view of the electronic component mounting apparatus of this first embodiment, FIG. 2 is a perspective view of the linear-motion device of the first embodiment, FIG. 3 is a sectional view of the linear-motion device of FIG. 2 taken along the line A-A, FIG. 4 is a side view of the linear-motion device of the first embodiment, and FIG. 5 is a plan view showing a positional relationship between board and image pickup device.

First, construction and operation of the electronic component mounting apparatus 1 are described. Referring to FIG. 1, the electronic component mounting apparatus 1 is made up of a board conveyance unit 3 provided on a base 2, electronic component feeding devices 4, a first linear-motion device 5, second linear-motion devices 6, and mounting heads 7. A top surface of the base 2 serves as a working plane 2a forming a horizontal plane, on which the mounting work is carried out. The board conveyance unit 3, which has a function of conveying a board 8 in an X direction as well as a function of holding the board 8 in a specified position on the working plane 2a, carries in the before-mounting board 8 into the electronic component mounting apparatus 1, maintains the board 8 held in the specified position during the mounting, and releases from the hold and carries the board 8 out of the electronic component mounting apparatus 1 after the mounting. It is noted that in the following description, a conveyance direction for the board 8 is assumed as the X-direction while a direction orthogonal to the direction within a horizontal plane is assumed as the Y direction. The electronic component feeding devices 4, having a function of feeding a plurality of electronic components accommodated inside thereof to its outside in units of a specified count in a specified posture, are provided in plurality on both sides of the board conveyance unit 3.

The first linear-motion device 5 and the second linear-motion devices 6 have a function of linearly moving an object back and forth in the Y direction and the X direction, respectively, above the base 2. More specifically, each of the second linear-motion devices 6 has its one end supported by the first linear-motion device 5, and driving the first linear-motion device 5 allows the second linear-motion devices 6 to move back and forth in the Y direction. Also, the mounting heads 7 are supported by the second linear-motion devices 6, respectively, and driving the second linear-motion devices 6 allows the mounting heads 7 to move back and forth in the X direction. Accordingly, by combinations of drive of the first linear-motion device (Y robot) 5 and the second linear-motion devices (X robots) 6, the mounting heads 7 can be moved horizontally (X-Y move) above the base 2 so as to be positioned at arbitrary positions. Each of the mounting heads 7 is provided with a plurality of nozzles 9 for sucking up electronic components, and the nozzles 9 suck up electronic components fed from the electronic component feeding devices 4 and mount them onto the board 8.

Next, construction and operation of the second linear-motion devices 6 are explained. Referring to FIGS. 2 and 3, each of the second linear-motion devices 6 includes a beam 10, which is a first beam provided so as to extend along the X direction (first direction) parallel to the working plane 2a (see FIG. 1), a pair of guides 11 provided at side portion of the first beam 10 in the Y direction (second direction) so as to extend along the X direction, a slider 12 provided on the pair of guides 11 so as to be movable along the X direction, and a linear motor (drive unit) made up of a mover 13 provided on the slider 12 and a stator 14 provided on the beam 10.

The beam 10 is so structured that rectangular-cylindrical members 10a, 10b, 10c made of carbon fiber reinforced plastics (CFRP) are stacked in a Z direction, where the second rectangular-cylindrical members 10b, 10c are placed on both sides of the first rectangular-cylindrical member 10a. CFRP, which is a composite material molded by impregnating carbon fiber with epoxy resin or other polymer material and thereafter curing the material, is excellent in strength and has a feature that CFRP, even if equivalent in strength and rigidity to iron, aluminum or other metals, can be made lower in weight than those metals. On the other hand, there is a difficulty in machining of carbon fiber, making it difficult to mold CFRP into complex configurations. However, in this first embodiment, since the beam 10 is integrally molded by stacking along the Z direction the three rectangular-cylindrical members 10a, 10b, 10c, whose respective cross-sectional shapes are relatively simple rectangular shapes, there is no special difficulty in its manufacturing process, so that such effects of CFRP as high rigidity and light weight can effectively be obtained.

On surfaces of the second rectangular-cylindrical members 10b, 10c confronting the slider 12, the one pair of guides 11 are provided so as to extend along the X direction, while on a surface of the first rectangular-cylindrical member 10a confronting the slider 12, the stator 14 is provided so as to extend along the X direction. In addition, the surfaces of the first rectangular-cylindrical member 10a and the second rectangular-cylindrical members 10b, 10c confronting the slider 12 are provided with recessed step gaps, respectively, each corresponding to a Y-directional size difference between the pair of guides 11 and the linear motor, where the first rectangular-cylindrical member 10a is shorter in Y-directional width than the second rectangular-cylindrical members 10b, 10c.

At places of the slider 12 confronting the second rectangular-cylindrical members 10b, 10c, guide blocks 15 are provided so as to be slidable in the X direction in engagement with the pair of guides 11. At a place of the slider 12 confronting the first rectangular-cylindrical member 10a, the mover 13 is provided via spacers 16 so as to be opposed to the stator 14 with a specified distance (gap) therebetween. On one side of the mover 13 confronting the slider 12, radiating fins 17 are provided along the X direction so as to project into a void portion 'a' formed between the mover 13 and the slider 12. At an end portion of the beam 10 is provided a fan 18 which forms an air flow in the X direction in the void portion 'a' formed between the mover 13 and the slider 12.

When an electric current is passed through a coil contained on the mover 13 side of the linear motor forming the linear-motion mechanism to generate a magnetic flux, propulsive power is produced in the mover 13 by attractive force and repulsive force that act against permanent magnets arranged in the stator 14, causing the slider 12 to move in the X direction. In the mover 13, heat generation occurs due to the current, but the heat is less transferred to the slider 12 side because of a heat insulating effect by the air layer present in the void portion 'a' as well as a heat insulating effect by the spacers 16 formed from a heat insulating material of small thermal conductivity such as ceramics or phenol resin. Also, since the void portion 'a' plays the role of a vent hole during the move of the slider 12, heat generated in the mover 13 by the electric current is radiated from the radiating fins 17. During a halt of the slider 12, since the heat generated in the mover 13 keeps remaining around the radiating fins 17, an air flow in the X direction is forcedly formed in the void portion 'a' by the drive of the fan 18 to accelerate heat radiation.

As a result, any inhibition of a smooth move of the slider 12 due to thermal deformation of the slider 12 or the guides 11 is prevented, so that improvement in positional accuracy and improvement in durability of the guides 11 can be fulfilled. Further, whereas a strong suction force due to magnetic force acts between the mover 13 and the stator 14, two junction portions 19 formed by mutually confronting side faces of the three rectangular-cylindrical members 10a, 10b, 10c, which constitute the beam 10, serve as ribs, functioning to minimize the displacement of the gap between the mover 13 and the stator 14 as well as the deformation of the pair of guides 11 so that inhibition of the smooth move of the slider 12 due to the suction force acting between the mover 13 and the stator 14 as well as any deterioration of the positional accuracy are prevented. It is noted that the closer the fan 18 serving as an air flow forming means is to the radiating fins 17, the stronger the air flow that can be formed becomes, so that a higher heat radiation effect can be expected when the fan 18 is provided integrally with the slider 12 and maintained close to the radiating fins 17 at all times regardless of the position of the slider 12.

Also, the first linear-motion device 5, which is similar in structure to the second linear-motion devices 6 described above, includes a beam (second beam) 25 extending along the Y direction, a pair of guides 26 provided on side portions of the beam 25 in the X direction so as to extend along the Y direction, a slider 27 provided on the pair of guides 26 so as to be movable along the Y direction, and a linear motor (drive unit) as a linear-motion mechanism. On one side of the slider 27 confronting the guides 26 are provided guide blocks 28 to engage with the pair of guides 11, where the slider 27 is made slidable along the Y direction by the drive of the linear motor. The second linear-motion devices 6 are placed with their one end cantilever-supported on the slider 27.

Referring to FIG. 3, an upper portion of the slider 12 is formed into an upper arm 12a that extends above the beam 10 and projects on the opposite side, where a control board 20 for performing operation control of the mounting heads 7 is provided at a site above the beam 10. The control board 20 is connected to an unshown main control unit for performing operation control over the whole electronic component mounting apparatus 1 as well as to power supply, where a connecting cable therefor is wired on one side opposite to the slider 12 across the beam 10. Referring to FIG. 4, a wiring box 22 for forming a wiring path of the connecting cable 21 is provided on one side of the beam 10 in the Y direction.

The wiring box 22 is an elongated rectangular-cylindrical member, one end of which is fixed at the projecting portion of the upper arm 12a of the slider 12 and the other end of which is fixed at a lower bracket 23. The lower bracket 23 is provided so as to extend from a lower portion of the beam 10 sideways along the X direction, where the other end of the wiring box 22 is fixed so as to open toward one end side on which the beam 10 is supported by the first linear-motion device 5. The wiring cable 21 connected to the control board 20 is led to one end side of the beam 10 and connected to the main control unit via the second linear-motion device 6. The wiring box 22, having flexibility, can easily change the wiring path of the connecting cable 21 formed between its one end that moves along with the X-directional move of the slider 12 and the other end fixed to the lower bracket 23.

In each of the second linear-motion devices 6, as shown above, the control board 20 of a relatively larger weight, the mounting head 7 and the wiring path of the connecting cable 21 are located at specified positions of the beam 10 by taking into consideration their weight balance so that weights acting on the beam 10 are properly balanced. More specifically, with the control board 20 placed upward of the beam 10, the mounting head 7 and the connecting cable 21 are placed on both sides of the beam 10 so as to sandwich the control board 20 therebetween, by which the weights acting on the beam are properly balanced. In particular, when a center of the weight balance is placed close to a cross-sectional center of the beam 10, loads applied to the guide blocks 28, which allow the slider 27 to be engaged with the guides 26, become roughly even, making it possible to eliminate unevenness of frictional force generated between the guides 26 and the guide blocks and thus achieve a smooth move of the slider and prevent uneven wear, which contributes to improvement of the durability. Also, since twists or other deformation of the beam 10 is suppressed, inhibition of the smooth move of the slider 12 as well as deterioration of the positional accuracy can be prevented. In addition, the control board 20 may also be placed below the beam 10, and the Y-directional position of the control board 20 may be changed in consideration of the weight balance of the mounting head 7 and the wiring path of the connecting cable 21.

In FIGS. 2, 3 and 4, a camera 30 is provided on one side of the slider 12 on which the guide blocks 15 are provided. The camera 30, which is an image pickup device for picking up an image of the board 8 or electronic components thereon to recognize the position of the board 8 or the mounting position for the electronic components on the board 8, moves integrally with the slider 12 and picks up an image of a position recognition mark or mounting position (not shown) on the board 8. By the image pickup of the position recognition mark by the camera 30, a positional relation between the individual nozzles 9 of the mounting head 7 set on the slider 12 and the board 8 is recognized, and mounting of the electronic components is carried out based on the resulting positional relation.

The camera 30 is an L-shaped camera that performs a 90° optical axis conversion by using a mirror or the like. As shown in FIG. 3, the camera 30 is placed in adjacency to the mounting head 7 between the beam 10 and the slider 12 so as not to obstruct electronic-component suction and mounting operations by the nozzles 9, and is prevented from going out of a Y-directional width W1 of the mounting head 7 and the beam 10. Also, as shown in FIG. 4, the camera 30 is placed at a generally center of the plurality of nozzles 9 arrayed in the X direction in the mounting head 7, and prevented from going out of an X-directional width W2 of the mounting head. It is noted that each of the mounting heads 7 of this first embodiment is provided with totally eight nozzles 9, four rows in the X direction and two rows in the Y direction.

Referring to FIG. 5, since electronic component mounting is performed by using all the nozzles 9 provided in the mounting heads 7, a moving region R for the mounting heads 7 is so set that all the nozzles 9 are enabled to move above and all over the entire board 8. In this setting, an X-directional moving region R for the mounting heads 7 is so set that all the nozzles 9, when positioned in their moving ends, are located outer than X-directional both-end positions 8a, 8b of the board 8. The camera 30, positioned at a generally center of the nozzles 9 arrayed in four rows in the X direction, is enabled to move outer than the X-directional both-end positions 8a, 8b of the board 8 along with the movement of each mounting head 7 within the moving region R, thus allowing the entire region of the board 8 to be targeted for image pickup. Therefore, since the slider 12 has only to be movable in the X direction by a distance necessary to ensure the moving region R of each mounting head 7, the moving-axis length of each second linear-motion device 6 has only to be enough to ensure the X-directional moving region R of each mounting head 7. That is, the beam 25 of each second linear-motion device 6 has only to have enough length to ensure the X-directional moving region R of each mounting head 7.

By the implementation of a proper placement of the camera 30 as shown above, in setting the moving-axis length of each second linear-motion device 6, there is no need for ensuring a moving distance of the slider 12 in consideration of the image pickup region of the camera 30, so that the moving-axis length of each second linear-motion device 6 can be reduced. This reduction of the moving-axis length of each second linear-motion device 6 makes it possible to reduce the equipment width (width in the X direction) of the electronic component mounting apparatus 1 determined by a value resulting from summation of the moving-axis length of each second linear-motion device 6 and the width of the first linear-motion device 5 (its width in the X direction). Thus, it becomes implementable to shorten an equipment length L of the electronic component mounting apparatus in the conveyance direction of the board 8, so that an improvement in the areal productivity can be achieved.

Also, in the case where one first linear-motion device 5 is provided with two parallel second linear-motion devices 6, and where the mounting head 7 and the camera 30 are included in each of the second linear-motion devices, as in the electronic component mounting apparatus 1 of this first embodiment, when each of the cameras 30 is placed at such a position as not to go outside the Y-directional total width of the mounting head 7 and the beam 10, there occurs no interference between those cameras 30, allowing the two mounting heads 7 to be moved closer to each other to work concurrently, so that an improvement in the production efficiency can be achieved.

Further, by the adoption of a placement configuration that the camera 30 adjoins the mounting head 7 via the slider 12, the Y-directional moving region of each second linear-motion device 6 can be reduced to a necessary minimum, so that the Y-directional length, i.e. moving-axis length, of the first linear-motion device 5 can be reduced, allowing a size reduction of the first linear-motion device 5 to be achieved.

Keeping smaller the moving-axis lengths of the first linear-motion device 5 and the second linear-motion devices 6, respectively, as shown above makes it possible to reduce the size of the Cartesian robot itself, so that an improvement in areal productivity can be achieved while replacement of the Cartesian robot becomes easier to do. It is noted that the camera 30, which is provided not on the mounting head 7 but on the slider 12, is never removed from the slider 12 during the replacement of the mounting head 7, so that performing its positional calibration relative to the mounting head 7 after the replacement eliminates the need for its positional calibration relative to the slider 12.

Although a linear motor is used as the linear-motion mechanism for moving the slider 12 in the first embodiment, it is also possible to use a feed screw mechanism instead of the linear motor, where the stator serving as a stationary part is replaced with a feed screw driving part while the mover serving as a movable part is replaced with a nut to engage with the feed screw. In this case, the junction portions 19 of the rectangular-in-cross-section rectangular-cylindrical members 10a, 10b, 10c, which constitute the beam 10, play the role of ribs, so that the mounting rigidity of the feed screw driving part is improved. Therefore, displacement of the rotational axis of the feed screw is suppressed, keeping the nut free from inhibition of its smooth move, so that the slider 12 can be prevented from deterioration of its positional accuracy. On the slider 12, camera or other image pickup devices, paste applicator or the like may also be placed in addition to the mounting heads 7, in which case quality improvement can be expected without deteriorating the positional accuracy, no matter which devices are set on the slider 12.

Furthermore, although the first embodiment has been described on such a construction that with two second linear-motion devices 6 provided, cameras 30 provided on those devices, respectively, are prevented from interference therebetween, the apparatus construction may also be that one second linear-motion device 6 is provided other than the above case, even in which case the effects of the first embodiment can also be obtained.

Second Embodiment

Next, an electronic component mounting apparatus including a linear-motion device which is an example of a moving device according to a second embodiment of the invention is explained. A sectional view of a second linear-motion device 56 included in the electronic component mounting apparatus of this second embodiment is shown FIG. 6, and its side view is shown in FIG. 7. The electronic component mounting apparatus of the second embodiment differs from the first embodiment in the construction of the camera (image pickup device) fixed on the slider, and only this different point will be explained below. It is noted that in the linear-motion device of the second embodiment, like component members in conjunction with the linear-motion device of the first embodiment are designated by like reference numerals and their description is omitted.

Figure 6:
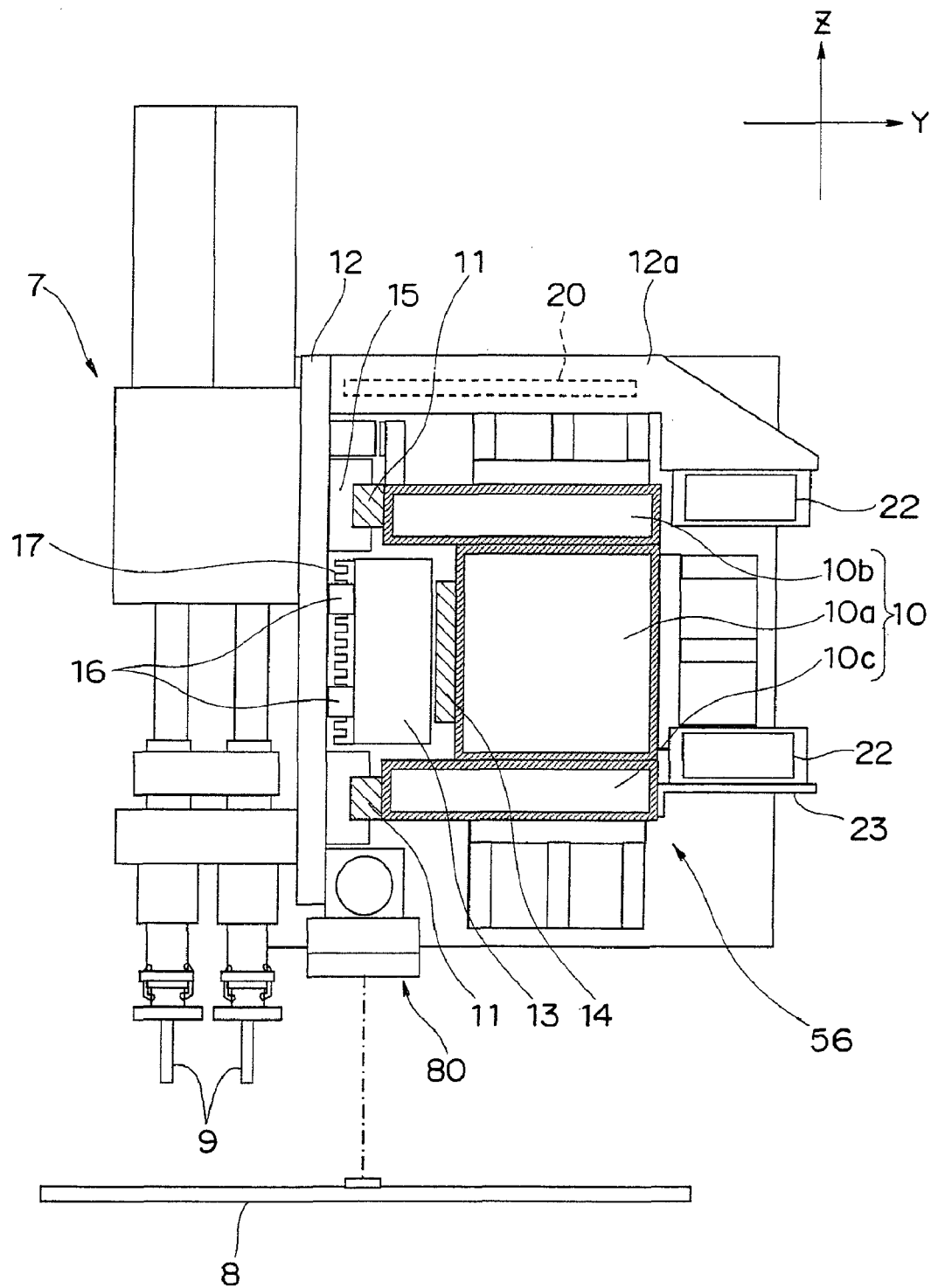
FIG. 6 is a schematic sectional view of a linear-motion device according to a second embodiment of the invention.
Figure 7:
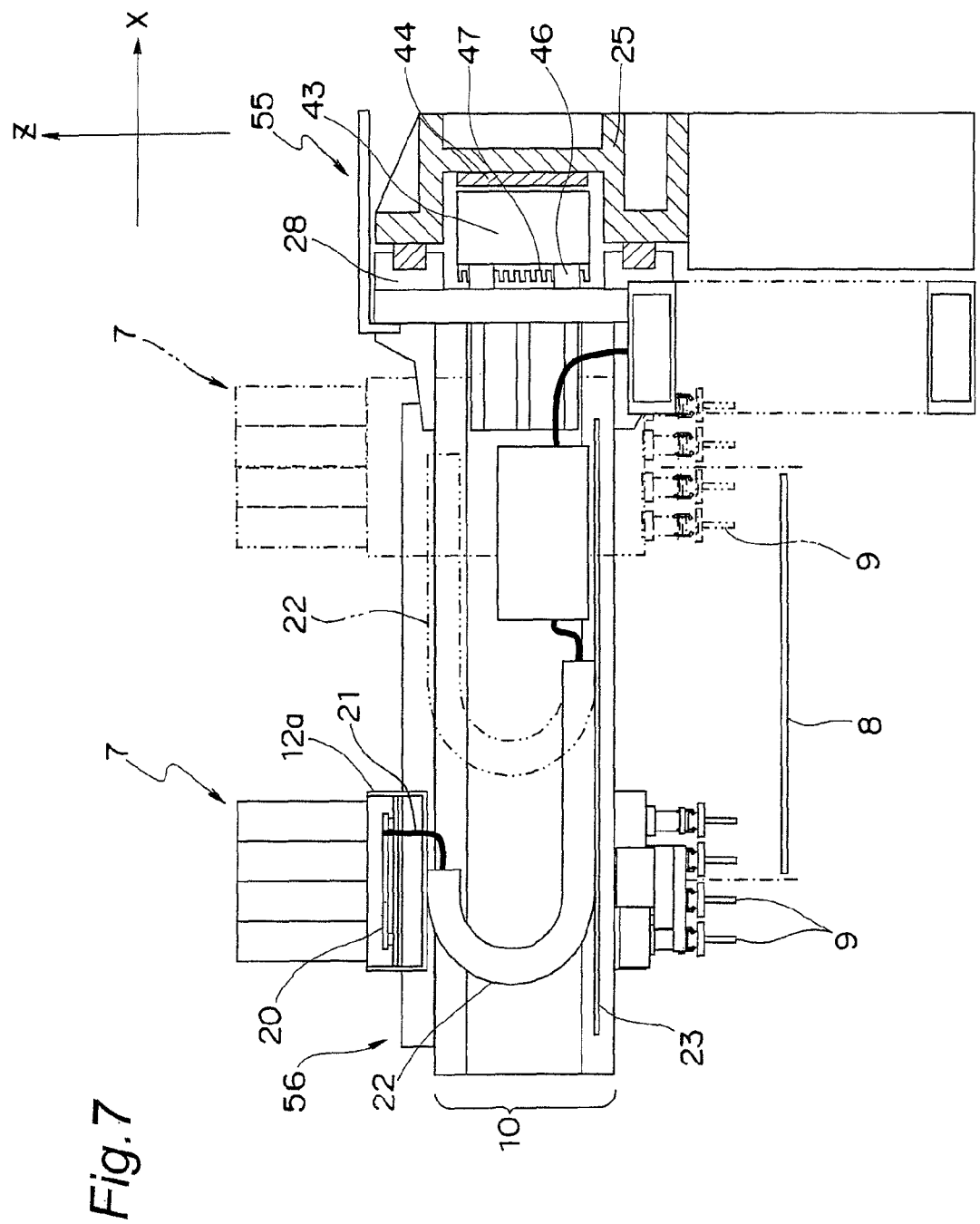
FIG. 7 is a schematic side view of the linear-motion device of the second embodiment.

As shown in FIGS. 6 and 7, on the slider 12 supported by the second linear-motion device 56 so as to be movable in the X direction, a camera 80 is fixed on one side face of the slider 12 opposite to the side face on which the mounting heads 7 are fixed, the camera 80 being enabled to move integrally with the slider 12.

Although not shown in the description of the first embodiment, a first linear-motion device 55 for moving the second linear-motion device 56 in the Y direction includes a mover 43 and a stator 44, which constitute a linear motor, radiating fins 47 for radiating heat of the mover 43, and spacers 46.

Figure 8A:
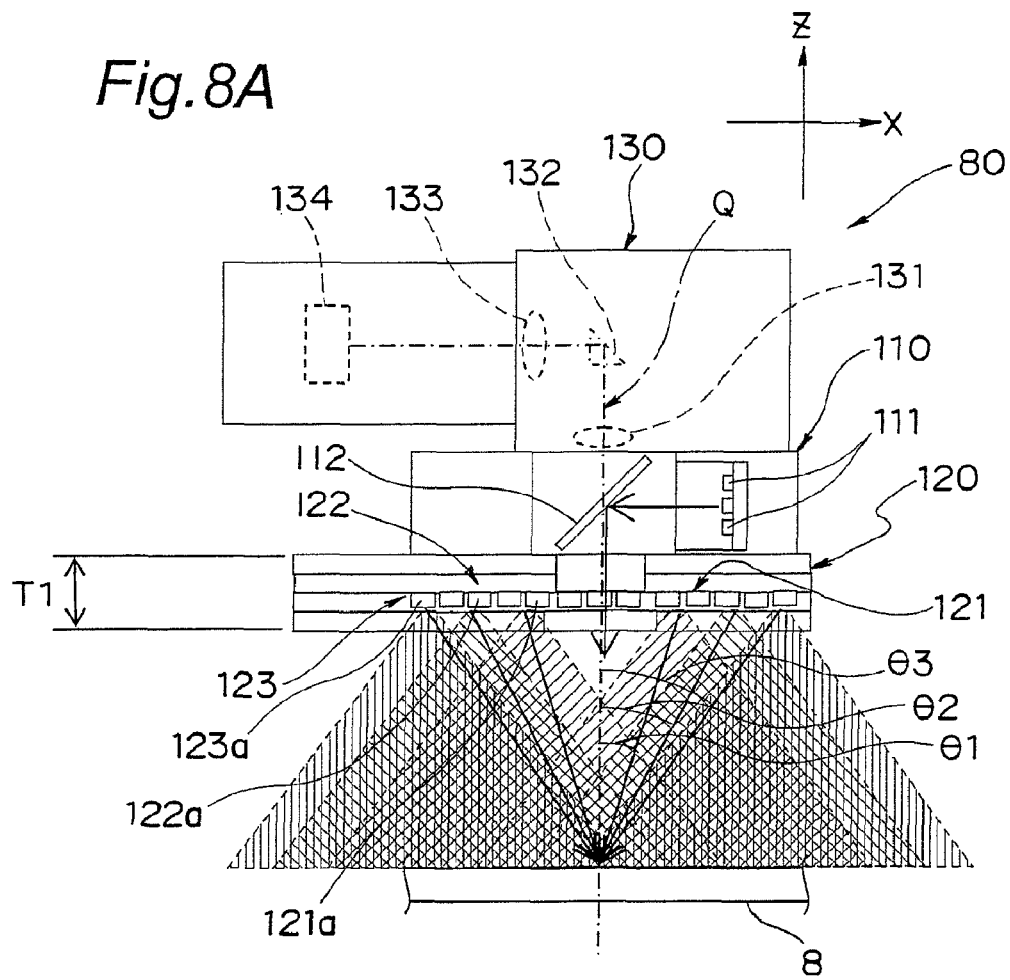
FIG. 8A is a schematic constructional view showing the construction of a camera included in the linear-motion device of the second embodiment.
Figure 8B:
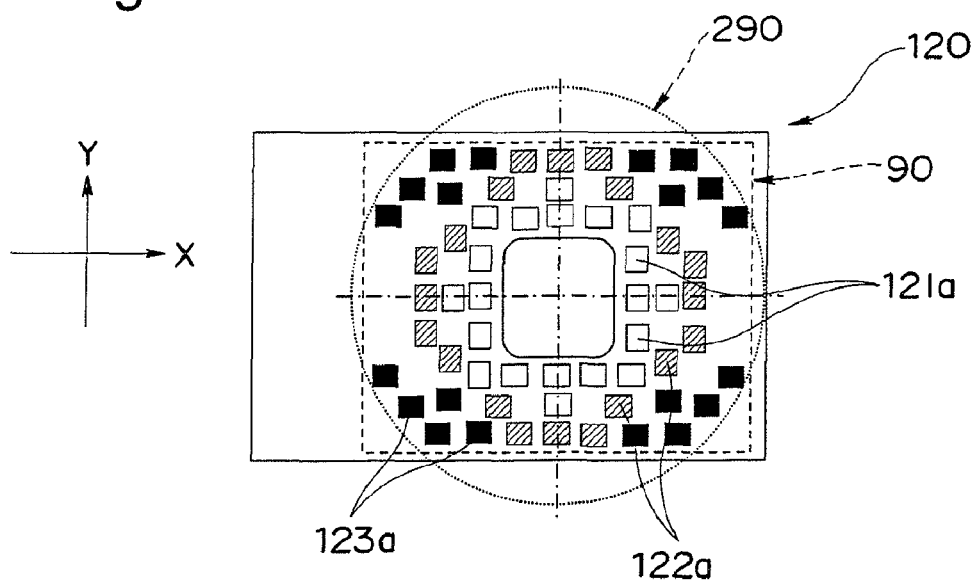
FIG. 8B is a schematic bottom view of a planar illumination unit of the camera of FIG. 8A.

A schematic side view of the camera 80 of the second embodiment is shown in FIG. 8A, and a schematic planar arrangement view of a light illuminating device is shown in FIG. 8B. Also, as a comparative object for the camera 80 of the second embodiment, a schematic side view of a camera 280 which has been used in conventional electronic component mounting apparatuses is shown in FIG. 9A, and a schematic planar arrangement view of its light illuminating device is shown in FIG. 9B.

Figure 9A:
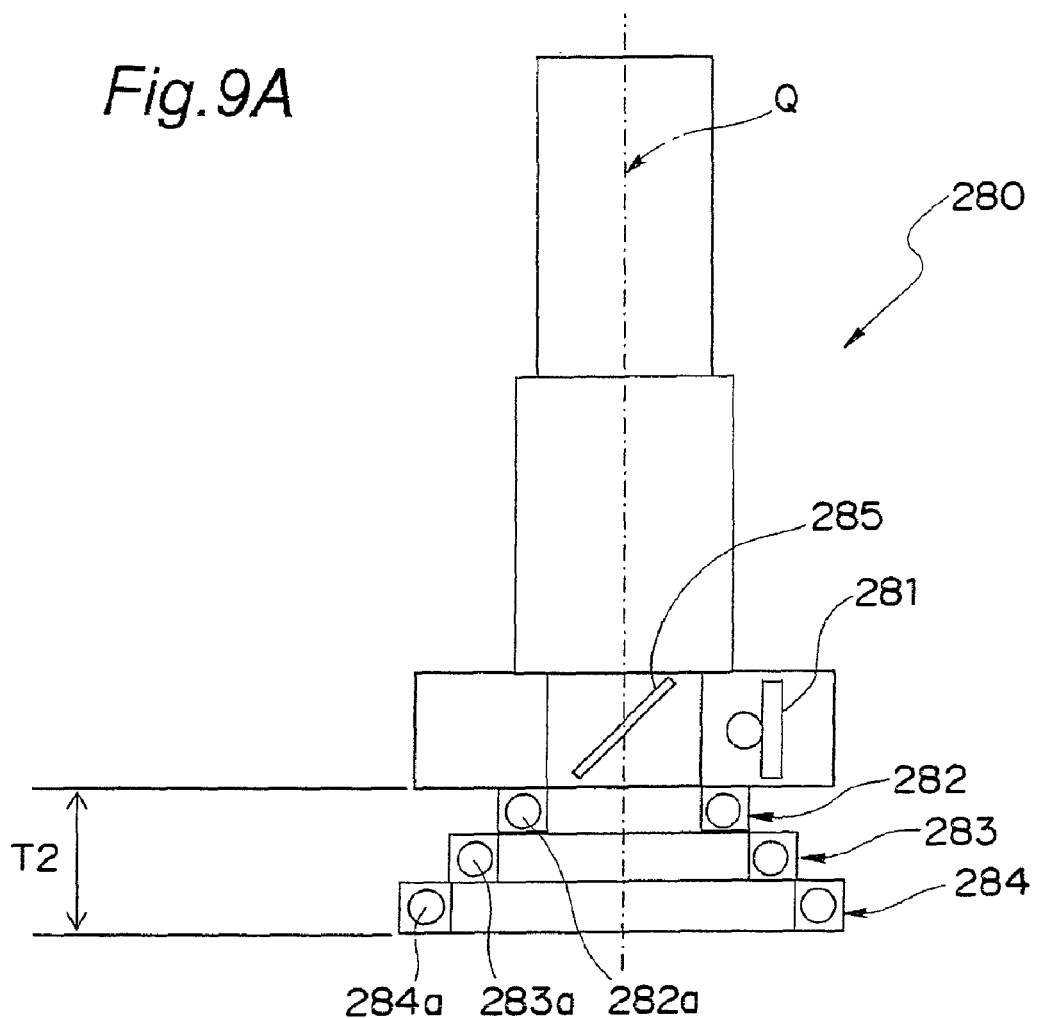
FIG. 9A is a schematic constructional view showing the construction of a conventional camera.
Figure 9B:
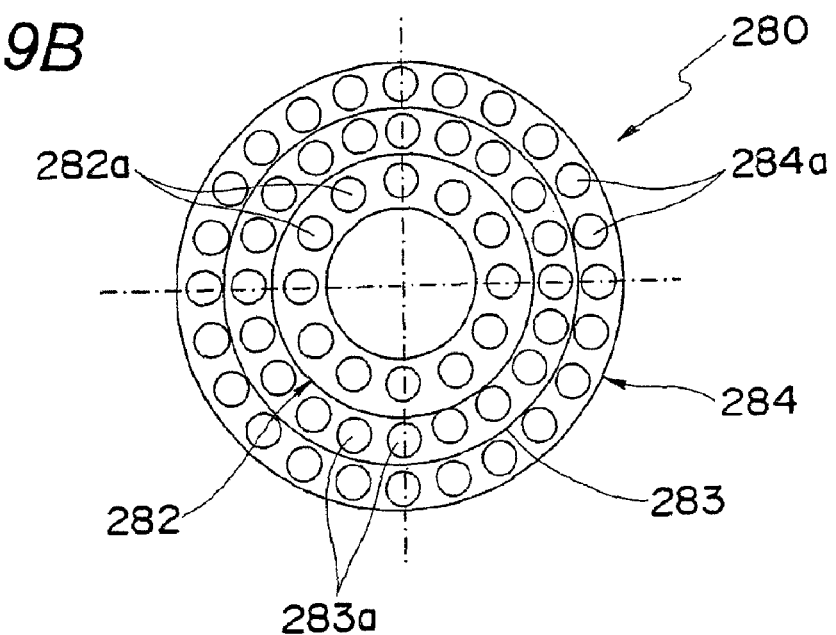
FIG. 9B is a schematic bottom view of the illumination unit of the camera of FIG. 9A.

First, construction of the conventional camera 280 as the comparative object is explained with reference to FIGS. 9A and 9B.

shown in FIGS. 9A and 9B, the conventional camera 280 includes a coaxial illumination light source unit 281 for illuminating an image pickup object with light in a vertical direction, as well as an upper-stage illumination light source unit 282, a middle-stage illumination light source unit 283 and a lower-stage illumination light source unit 284 for illuminating the image pickup object with light in inclined directions.

The coaxial illumination light source unit 281 horizontally emits light having directivity, which is then reflected vertically downwardly by a mirror 285 placed on an optical axis Q of the camera 280, so that the light having directivity is applied to an object (a position recognition mark on the board or the like). Also, the upper-stage illumination light source unit 282, the middle-stage illumination light source unit 283 and the lower-stage illumination light source unit 284 are arranged with their heightwise positions different from one another so that angles (illuminating angles) of light emitted from the individual illumination light source units differ from one another. For each of the illumination light source units 282, 283, 284, a plurality of LEDs 282a, 283a, 284a are employed. Also, in order that those illumination light source units do not interfere with one another, those LEDs 282a, 283a, 284a are arranged annularly around the optical axis with their planar positions different from one another. It is noted that the illuminating angle herein means an average illuminating angle of illuminating rays of light emitted from the plurality of LEDs constituting the individual light source units, respectively.

For the conventional camera 280 as shown above, which adopts a structure that three illumination light source units are different in height from one another, it is difficult to reduce the size in its heightwise direction. Also, since an annular arrangement of LEDs about the optical axis is adopted and since the three illumination light source units are different in height from one another, it is difficult to reduce the planar size of the camera 280.

Next, construction of the camera 80 of the second embodiment is explained with reference to FIGS. 8A and 8B.

As shown in FIGS. 8A and 8B, the camera 80 includes a coaxial illumination unit 110 for emitting coaxial light having directivity along the optical axis Q placed along the vertical direction, a planar illumination unit 120 for emitting light inclined with respect to an image pickup object, and an image pickup unit 130 for allowing an image of the image pickup object to be incident thereon along the optical axis Q to acquire the image.

The image pickup unit 130 is so structured that an image inputted along the optical axis Q through a lens 131 placed on the optical axis Q is changed in direction to the horizontal direction by a prism 132 so as to be focused on a light receiving element 134 through a lens 133.

The coaxial illumination unit 110 includes a plurality of LEDs 111 arranged so as to emit light toward the horizontal direction, and a half mirror 112 for reflecting the horizontally emitted light along the optical axis Q. The planar illumination unit 120 includes three types of illumination light source units (an example of the light illuminating device), a first illumination light source unit 121 for emitting light at an inclination angle $\theta 1$ with respect to the optical axis Q, a second illumination light source unit 122 for emitting light at an inclination angle $\theta 2$, and a third illumination light source unit 123 for emitting light at an inclination angle $\theta 3$. It is noted that those inclination angles (illuminating angles) have a relationship of $\theta 1 < \theta 2 < \theta 3$.

The first illumination light source unit 121 includes an array of a plurality of LEDs 121a for emitting diffused light of red color as an example, while the second illumination light source unit 122 similarly has an array of a plurality of LEDs 122a for emitting red diffused light. Also, the third illumination light source unit 123 has an array of LEDs 123a for emitting diffused light of white color as an example. In FIG. 8B, the LEDs 121a, 122a, 123a are patterned in different ways, respectively, so that those LEDs can be visually discerned respectively in their type. It is noted that types of the LEDs to be used for those individual illumination light source units are selected as required depending on the object and purpose of the image pickup.

As shown in FIG. 8B, the first illumination light source unit 121 is placed at a position closest to the optical axis Q in a roughly square-toroidal shape as an example, and the second illumination light source unit 122 is placed in a roughly square-toroidal shape so as to externally surround the first illumination light source unit 121. Then, the third illumination light source unit 123 is placed at four diagonal positions in a rectangular region (a region indicated by broken line in FIG. 8B) 90 which is outer than the second illumination light source unit 122 and which is formed into a rectangle centered on the optical axis Q. It is noted that the rectangular region 90 is so set that its Y-directional sides are shorter than its X-directional sides. Desirably, the placement of these individual illumination light source units is as nearly point-symmetrical as possible with respect to the optical axis Q. Also, as shown in FIG. 8A, the illumination light source units 121, 122, 123 are placed on one identical horizontal plane. More specifically, a structure in which the illumination light source units are placed on a single flat-plate illumination board 129 is adopted.

In the planar illumination unit 120 having such a structure as described above, the first illumination light source unit 121, the second illumination light source unit 122 and the third illumination light source unit 123, which are plural independent light source units for emitting illuminating light at respectively different illuminating angles θ1, θ2 and θ3 onto the board surface, are controlled according to previously stored illumination data, so that an image pickup object can be illuminated with proper light. For example, light for the illumination is changed depending on surface property characteristics of the image pickup object. That is, nearly coaxial illuminating light is used for objects of total reflection, while externally angled illuminating light is used for objects of diffused reflection. Further, with a view to fulfilling the best illumination state corresponding to recognition type and recognition purpose of image-pickup data, illumination patterns are set in combinations among on/off states and illumination intensities of the individual illumination light source units, and the planar illumination unit 120 is controlled based on this setting.

By using the camera 80 of the second embodiment as described above, the following various effects can be obtained.

First, although the arrangement that the third illumination light source unit 123 is placed at four diagonal positions in the rectangular region 90 centered on the optical axis Q leads to more or less impairment of the point symmetry of illuminating light applied to the board, which is an image pickup object, yet the placement of the third illumination light source unit 123 at the largest distance from the optical axis Q with a lengthened illumination distance makes it possible to obtain such a generally uniform illuminating light distribution that the image pickup is achievable without problems. Also, the adoption of such a planar arrangement of the illumination light source units allows the planar illumination unit 120 to be reduced in planar size as much as possible, so that the camera 80 can be made compact in its planar dimension. For example, as shown in FIG. 8B, from a comparison between an illumination size 290 in the conventional camera 280 of FIG. 9B and an illumination size (rectangular region) 90 of the camera 80 of this second embodiment, it can be understood that the planar illumination unit 120 of the camera 80 has been made more compact in the Y direction.

Further, the arrangement of the planar illumination unit 120, in which the illumination light source units 121, 122, 123 are placed on the single flat-plate illumination board 129, allows the planar illumination unit 120 to be made as thin as possible in its thickness T1. In such an arrangement as in the illumination unit of the conventional camera 280, in which three types of independent illumination light source units are placed in three stages in the vertical direction, since the illumination unit has a thickness T2 resulting from summation of the thicknesses of the three illumination light source units, the heightwise compacting of the illumination unit is inhibited. In contrast to this, the planar illumination unit 120 of the second embodiment can be made more compact in its heightwise dimension. Since the compacting in the heightwise dimension can be fulfilled, it is also possible, for example, to fulfill an arrangement that the camera 80 is placed immediately under the beam 10.

Accordingly, in the status quo that mounting equipment has been progressing toward downsizing in response to the downsizing and mounting density enhancement of boards on which electronic components are mounted, it becomes practicable to meet the demand for more compactness in the heightwise dimension and the planar occupational dimension of mounting heads.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

According to the present invention, since the image pickup device is placed at such a position as to be contained within an extension of the mounting heads in one direction, there can be obtained an advantage that extension of the linear-motion devices in one direction can be lessened, making it possible to realize the downsizing of Cartesian robots in which the linear-motion devices are provided orthogonal to each other, hence usefulness in the field of electronic component mounting.

The entire disclosure of Japanese Patent Application No. 2006-299929 filed on Nov. 6, 2006, including specification, drawings, and claims, are incorporated herein by reference in its entirety.

The invention claimed is:

1. A moving device for moving a mounting head which holds and mounts electronic components onto a board, the mounting device comprising:
   a first beam which extends in a first direction;
   a slider provided on one side face of the first beam so as to be movable in the first direction, the slider having a first side face and a second side face opposite to the first side face;
   a first drive unit for driving movement of the slider along the first direction;

a mounting head which is fixed to the second side face of the slider so as to be movable integrally with the slider, the mounting head having a plurality of nozzles for holding the electronic components, and the nozzles being arrayed in the first direction;

an image pickup device, which is fixed to the first side face of the slider so as to be movable integrally with the slider, for picking up an image of a mounting position for the electronic components on the board;

a second beam for supporting the first beam so that the first beam is movable in a second direction orthogonal to the first direction; and a second drive unit for driving movement of the first beam along the second direction, wherein the image pickup device is placed at such a position as to be contained within a width of an array of the nozzles in the first direction and contained within a total width of the mounting head and the first beam in the second direction.

2. The moving device as defined in claim 1, wherein the mounting head, the image pickup device, the slider, the first beam and the first drive unit are provided in a plurality of sets, respectively, and wherein the second beam supports the plurality of first beams so that the first beams are movable independently of each other.

3. An electronic component mounting apparatus comprising:

a board holding unit for holding the board along a working plane; and the moving device as defined in claim 2, wherein mounting of the electronic components onto the board held by the board holding unit is performed by the mounting head moved parallel to the working plane by the moving device.

4. The moving device as defined in claim 1, wherein the image pickup device includes a plurality of first light illuminating units for emitting light at a first illuminating angle toward a mounting position for the electronic components on the board and a plurality of second light illuminating units for emitting light at a second illuminating angle different from the first illuminating angle toward the mounting position, and at a lower portion of the image pickup device, the plurality of first light illuminating units and the plurality of second light illuminating units are placed on one identical plane extending along a surface of the board.

5. The moving device as defined in claim 4, wherein a placement region of the plurality of first light illuminating units and the second light illuminating units on the identical plane is so set that a width thereof in the second direction is shorter than a width thereof in the first direction.

6. An electronic component mounting apparatus comprising:

a board holding unit for holding the board along a working plane; and the moving device as defined in claim 5, wherein mounting of the electronic components onto the board held by the board holding unit is performed by the mounting head moved parallel to the working plane by the moving device.

7. An electronic component mounting apparatus comprising:

a board holding unit for holding the board along a working plane; and the moving device as defined in claim 4, wherein mounting of the electronic components onto the board held by the board holding unit is performed by the mounting head moved parallel to the working plane by the moving device.

8. An electronic component mounting apparatus comprising:

a board holding unit for holding the board along a working plane; and the moving device as defined in claim 2, wherein mounting of the electronic components onto the board held by the board holding unit is performed by the mounting head moved parallel to the working plane by the moving device.

9. The moving device as defined in claim 1, wherein the first side face of the slider faces the first beam.

10. The moving device as defined in claim 1, wherein the mounting head is on the opposite side of the slider from the first beam.

11. The moving device as defined in claim 10, wherein the mounting head, the image pickup device, the slider, the first beam and the first drive unit are provided in a plurality of sets, respectively, and wherein the second beam supports the plurality of first beams so that the first beams are movable independently of each other.

12. An electronic component mounting apparatus comprising:

a board holding unit for holding the board along a working plane; and the moving device as defined in claim 11, wherein mounting of the electronic components onto the board held by the board holding unit is performed by the mounting head moved parallel to the working plane by the moving device.

13. The moving device as defined in claim 10, wherein the image pickup device includes a plurality of first light illuminating units for emitting light at a first illuminating angle toward a mounting position for the electronic components on the board and a plurality of second light illuminating units for emitting light at a second illuminating angle different from the first illuminating angle toward the mounting position, and at a lower portion of the image pickup device, the plurality of first light illuminating units and the plurality of second light illuminating units are placed on one identical plane extending along a surface of the board.

14. The moving device as defined in claim 13, wherein a placement region of the plurality of first light illuminating units and the second light illuminating units on the identical plane is so set that a width thereof in the second direction is shorter than a width thereof in the first direction.

15. An electronic component mounting apparatus comprising:

a board holding unit for holding the board along a working plane; and the moving device as defined in claim 14, wherein mounting of the electronic components onto the board held by the board holding unit is performed by the mounting head moved parallel to the working plane by the moving device.

16. An electronic component mounting apparatus comprising:
- a board holding unit for holding the board along a working plane; and
- the moving device as defined in claim 13,
- wherein mounting of the electronic components onto the board held by the board holding unit is performed by the mounting head moved parallel to the working plane by the moving device.

17. An electronic component mounting apparatus comprising:
- a board holding unit for holding the board along a working plane; and
- the moving device as defined in claim 10,
- wherein mounting of the electronic components onto the board held by the board holding unit is performed by the mounting head moved parallel to the working plane by the moving device.

* * * * *